United States Patent [19]

Cheatham et al.

[11] 4,075,671
[45] Feb. 21, 1978

[54] AUTOMATIC AC BIASING OF A MAGNETORESISTIVE ELEMENT

[75] Inventors: Samuel David Cheatham, Arvada; Julian Lewkowicz, Boulder, both of Colo.

[73] Assignee: International Business Machines Corporation, Armonk, N.Y.

[21] Appl. No.: 744,839

[22] Filed: Nov. 24, 1976

[51] Int. Cl.$^2$ .............................................. G11B 5/30
[52] U.S. Cl. ..................................... 360/113; 360/27; 324/252; 338/32 R; 324/235
[58] Field of Search ................... 360/113, 66, 67, 111, 360/112, 27; 340/174 RB, 174 CA; 338/32 R

[56] References Cited

U.S. PATENT DOCUMENTS

| | | | |
|---|---|---|---|
| 2,816,175 | 12/1957 | Blaney | 360/66 |
| 2,828,478 | 3/1958 | Johnson | 360/27 |

OTHER PUBLICATIONS

IBM Technical Disclosure Bulletin, vol. 19, No. 3, Aug. 1976, p. 789.

*Primary Examiner*—John H. Wolff
*Attorney, Agent, or Firm*—Gunter A. Hauptman

[57] ABSTRACT

Two magnetoresistive (MR) elements are connected with two matched impedance elements in a bridge arrangement for sensing magnetic flux manifesting information recorded on magnetic media. An alternating current (AC) bias is applied to the bridge's input, and short-term variations in the bridge output signal envelope are detected as representing recorded information. Long-term (average) variations in the signal envelope are also detected and used to adjust the AC bias to maintain a constant average envelope. Additional bridge inputs may be connected in parallel with the first, and the additional bridges' outputs used to derive additional information signals without any additional AC bias adjustment circuits.

8 Claims, 7 Drawing Figures

AUTOMATIC AC BIASING OF A MAGNETORESISTIVE ELEMENT

BACKGROUND OF THE INVENTION

1. Field of the Invention

The invention relates to circuits using magnetoresistive elements as magnetic transducers.

2. Description of the Prior Art

Magnetoresistive elements exhibiting a resistance dependent upon the intercepted magnetic flux have been biased by alternating current for a variety of purposes. In McCoubrey U.S. Pat. No. 2,571,915, an alternating magnetic field is applied to a magnetoresistive element to form a DC amplifier. A bridge arrangement of magnetoresistive elements uses an alternating current to achieve magnetic readback in Wiegand U.S. Pat. No. 2,918,534 and in de Koster U.S. Pat. No. RE26,610. The principles involved in biasing a magnetoresistive readback head with alternating current are explained by Sua-For Sun in the IEEE TRANSACTIONS ON AUDIO, Vol. AU-13 No. 2, pages 41–43. All of these devices exhibit deleterious signal drift, noise and instability due to the sensitivity of the magnetoresistive elements to temperature and current changes, power supply variations, media-head relationships, etc. While inductive heads are subject to a variety of different problems which subtract from the scope of their use, the inductive element is, nevertheless, functional under a wide variety of conditions than is the magnetoresistive element. A significant characteristic of a magnetoresistive element which is adversely affected by unpredictable variations is the element's signal amplitude. Control of an output amplitude as a function of the difference between the actual amplitude and a desired amplitude value is generally well known; for example, in the automatic control of the audio output volume of a broadcast receiver. Copending application Ser. No. 684,053, "Dynamic Transducer Biasing Signal Amplifying Circuitry", by J. D. Harr, filed May 6, 1976, assigned to International Business Machines Corporation, discloses a circuit for adjusting the DC bias of a magnetoresistive element to maintain linear operation as a function of an output.

The prior art discussed does not address the peculiar problems of maintaining linear operation of a readback transducer comprising magnetoresistive elements biased by alternating current. For example, the bridge-arranged magnetoresistive elements shown in the IBM TECHNICAL DISCLOSURE BULLETIN, Vol. 19, No. 3, August, 1976, page 789, exhibits an output signal envelope amplitude which significantly and unpredictably varies undesirably as a function of the previously listed variables. A signal, for controlling the amplitude as described in the referenced application Ser. No. 684,053, is not available because there is no DC output and there is no bias amplitude control.

SUMMARY OF THE INVENTION

Applicants have solved the problems exhibited by the prior art in a unique way. Alternating current bias is supplied to bridge-arranged magnetoresistive elements by a voltage-variable signal source. Bridge output signal peaks are detected and stored to give an indication of their average (envelope) value. The average output signal value controls the signal source to maintain a constant signal envelope regardless of external variables.

The foregoing and other objects, features and advantages of the invention will be apparent from the following more particular description of preferred embodiments of the invention, as illustrated in the accompanying drawings.

DESCRIPTION OF THE DRAWINGS

Referring to FIG. 1, an array of impedances 1 arranged into a bridge configuration comprising two fixed impedances Z1 and Z2 and two impedance elements ZH1 and ZH2 exhibiting the magnetoresistive effect are shown. The elements ZH1 and ZH2 are simultaneously exposed to a flux $\phi$ from magnetic media tracks which causes each of them to change resistance an incremental amount. If discrete magnetized areas on the magnetic media tracks manifest digital information, then the flux to which the bridge is exposed also represents the digital information, and the resistance change will in turn be a function of the information. The fixed impedances Z1 and Z2 equal ZH2 and ZH1, respectively, so that the bridge is balanced when the impedances ZH1 and ZH2 are not subject to flux $\phi$. As the amount of magnetic flux $\phi$ changes, the impedances of ZH1 and ZH2 change and unbalance the bridge 1. Any signal applied at the bridge input will appear at the bridge output as the bridge becomes unbalanced in accordance with the relationship:

Figure 1:
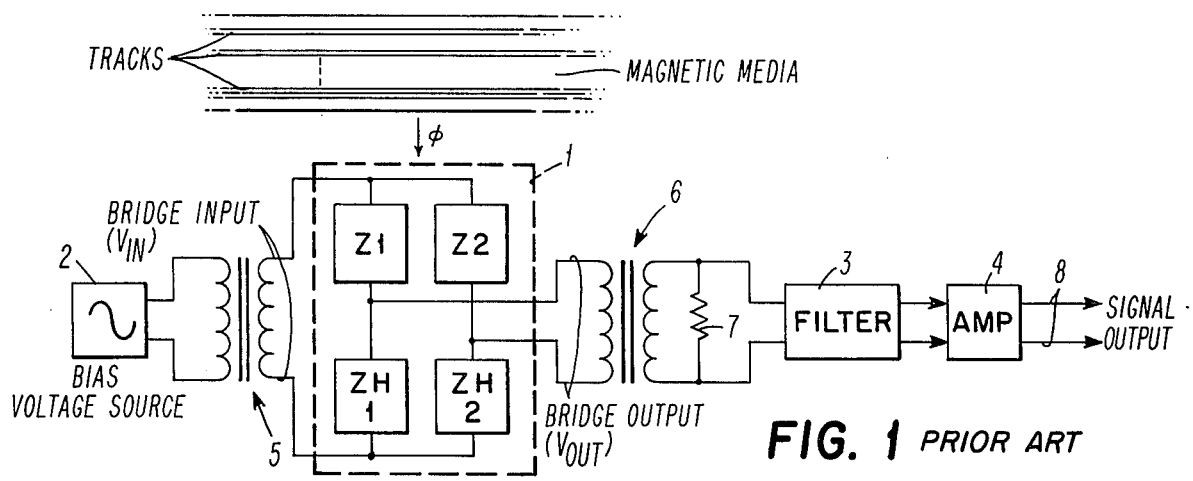
FIG. 1 is a functional diagram illustrating a prior art transducer assembly usable in the invention.

$$V_{out} = V_{in} \left( \frac{\Delta Z_{H1}}{Z_1 + Z_{H1} + \Delta Z_{H1}} - \frac{\Delta Z_{H2}}{Z_2 + Z_{H2} + \Delta Z_{H2}} \right);$$

where, $\Delta Z_{H1}$ is the change in impedance of the element $Z_{H1}$ due to the flux $\phi$ and $\Delta Z_{H2}$ is the impedance change in element $Z_{H2}$ due to flux $\phi$. The signal thus follows the digital information on the media. Here, the bridge input receives a signal from a bias voltage source 2 having peak values on the order of one to five volts at frequencies ranging from about 0.1 mHz to about 40 mHz. A transformer 5 is provided to improve noise rejection because, as shown, the transformer 5 rejects common mode signals and may also, if desired, match the impedance of the bias voltage source 2 to the bridge 1. Similarly, a transformer 6 is provided at the bridge 1 output for noise reduction and optional impedance transformation purposes. A resistor 7 is provided at the output of the transformer 6 to broaden its frequency response. A filter 3 is connected to the transformer 6 and resistor 7 to distinguish between signal components due to digital information from the media and components due to the bias voltage source 2. Typically, magnetic flux $\phi$ to which the bridge 1 is exposed represents information recorded as magnetic areas on media such as magnetic tape or magnetic disks at frequencies in the range of approximately 10 Hz to on the order of 10 mHz. In such a case, the filter 3 is designed to pass frequencies, in that range, which originate from the magnetic media and to block signals at other frequencies which originate from the bias voltage source 2. An amplifier 4, connected to the filter 3 to increase the level of signals for use at a signal output 8, may have a gain of approximately 100.

In effect, the circuit of FIG. 1 uses the bridge 1 to vary the bias voltage at its output as a function of the flux $\phi$ from the media. When the flux $\phi$ is zero, the bridge 1 is balanced and none of the bias voltage appears at the bridge output. As flux $\phi$ increases, the bridge unbalances and more bias voltage appears at the bridge output. Thus, the bridge output signal comprises the bias voltage signal varying inside an envelope amplitude determined by the flux magnitude changes. A bridge optimizes the effect of flux changes on the bias voltage as compared to other configurations because the flux changes are reflected as doubled signals at the bridge output, while bias voltage signals are practically eliminated. The filter 3 provides an electrical signal which is a function of the magnetic flux $\phi$ to which the bridge 1 is exposed; that is, a signal which follows the envelope amplitude as opposed to the instantaneous magnitude of the signal component originating from the bias voltage source. Filter 3 operation and design are enhanced and simplified if the bias voltage frequency is some multiple of the flux $\phi$ frequency. For example, it has been found that a ratio of about four-to-one (highest frequency of 40 mHz bias and 10 mHz flux signal) will give good results. However, this relationship is not believed to be essential. The bridge arrangement has the advantage of great sensitivity and, due to the cancelling effect of the separate elements of the bridge 1, it is somewhat immune to noise originating from temperature changes and external electrical fields. Further, as explained in the prior art, bias maintains the magnetoresistive elements ZH1 and ZH2 in their linear region of operation, while an alternating current bias additionally gives immunity from noise; for example, thermal noise caused by intermittent contact between the media and transducer elements. Disadvantages of the circuit described include the undesired drift of the quiescent level of the signal at output 8 due to changes in the circuit components, voltage power supplies variations, temperature changes, and the like. For example, if the bridge 1 is used to detect magnetic flux $\phi$ from media, the signal output level 8 will change as the spacing between the bridge 1 and the media changes independently of the information recorded on the media.

Figure 2A:
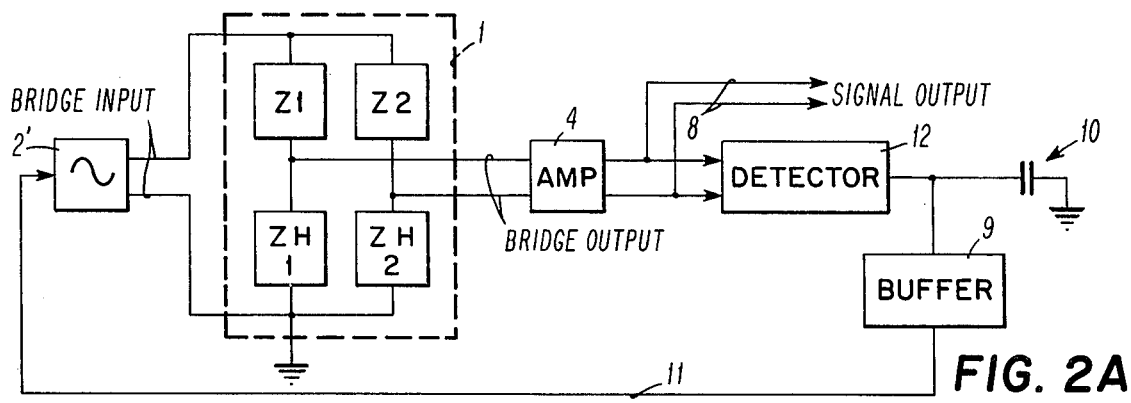
FIG. 2A illustrates a first embodiment of the invention and FIG. 2B shows a variation thereof.

The circuit of FIG. 2A attempts to overcome the disadvantages of the circuit of FIG. 1 while retaining the advantages described. There is added at the signal output 8 a circuit 12 for detecting voltage peaks of the signal at output 8. Such peak detection circuits are well known and generally operate by detecting the point at which the positive-to-negative, or negative-to-positive, slope transition (i.e., the rate of change is zero) in a signal occurs. The magnitude of the signal at output 8 at this time is gated by the circuit 12 to a storage device such as a capacitor 10. As successive signal output 8 peaks occur, the voltage across the capacitor 10 changes to represent the average peak voltage magnitude of the signal at output 8. A buffer amplifier 9 isolates the capacitor 10 from succeeding circuits and provides a varying DC signal voltage on line 11 corresponding to the average value of the peaks of the signal at output 8. The bias voltage source 2', a modified version of the source 2 in FIG. 1, gives a peak voltage output which is a function of the DC value on the line 11 from the buffer 9. For example, as the output of the buffer 9 increases in a positive direction, both the source 2' output and the input to the bridge 1 decreases as an inverse function of the feedback on the line 11. This control may be achieved in a number of ways; for example, by utilizing a voltage-controlled amplifier in the line between the bias voltage source 2' and the input to the bridge. The advantage of the circuit just described with reference to FIG. 2A is that undesirable effects which change the signal output 8 level over a period of time result in a compensating change in a DC voltage on the line 11 which in turn causes corresponding compensating changes in the bias voltage source 2' to exactly correct for the undesirable changes.

Figure 2B:
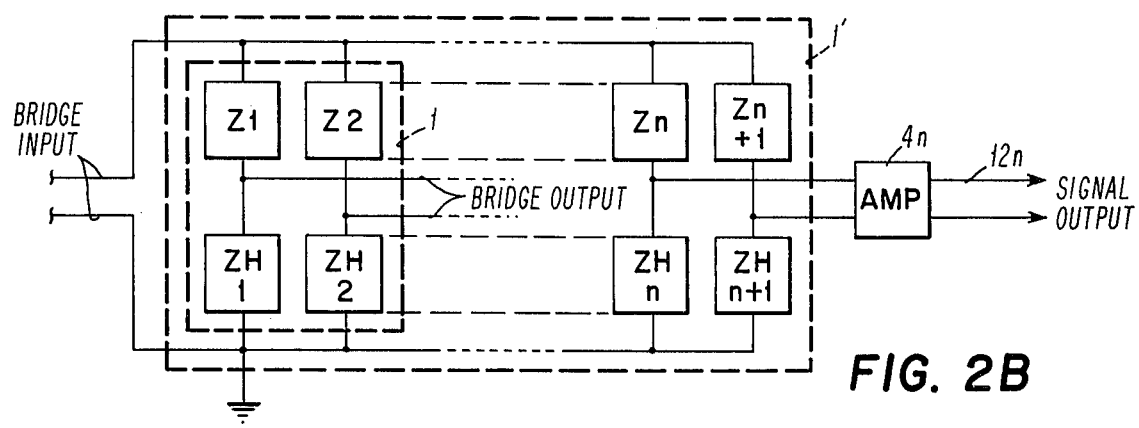

Referring to FIG. 2B, another embodiment of the circuit of FIG. 2A may particularly be advantageous where the bridge 1 is used as a head element to sense information recorded as magnetic areas on media. Since, when recording information on media, more than one track of magnetic information is usually recorded, it is advantageous to use more than one element for detecting the presence and absence of magnetic areas on the various tracks of the media. FIG. 2B illustrates one technique for providing plural bridge elements in a compensating feedback circuit of the type described in FIG. 2A. The bridge 1 is connected to a circuit identical to that of FIG. 2A and additional bridge configurations [such as Z3, Z4, ZH3, ZH4 and so on, not shown, extending to Zn, Z($n+1$), ZHn, ZH($n+1$)] are connected to corresponding amplifiers (such as 4', etc., not shown, and extending to 4$^n$) and then directly to signal outputs (12', 12''. . . 12$^n$) without the use of additional compensating feedback circuits. For example, a bridge configuration n comprising head elements ZHn and ZH($n+1$) and fixed impedances Zn and Z($n+1$) is connected to an amplifier 4n which is connected to a signal output 12n.

Figure 3:
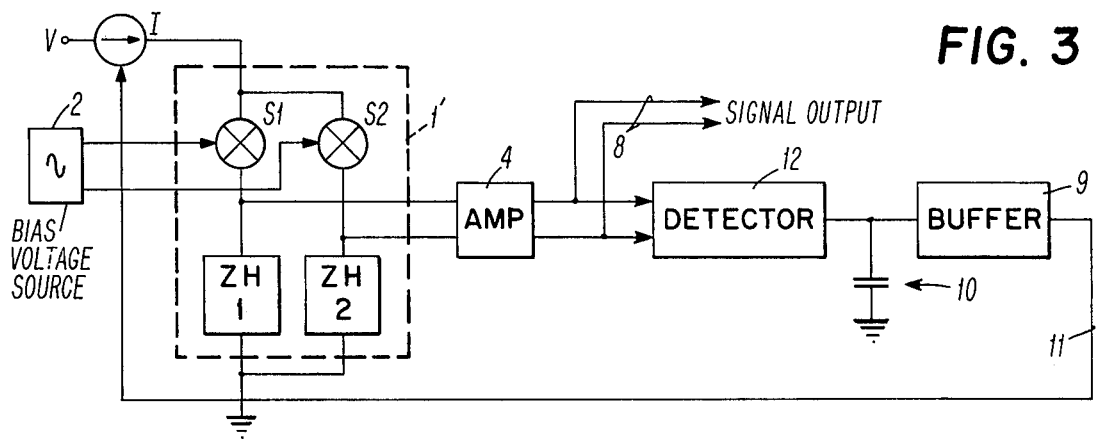
FIGS. 3 and 4 illustrate second and third embodiments of the invention.

FIG. 3 illustrates that the bridge 1 shown in FIGS. 1 and 2A may take different forms than a combination of magnetoresistive elements ZH1 and ZH2 and fixed impedances. The fixed impedances Z1 and Z2 shown in FIG. 1 are replaced by switches S1 and S2 (such as transistors) in series with a constant current source I and are switched alternately by the bias voltage source 2. This embodiment requires that the current source I be adjustable in accordance with a DC control voltage on the line 11. Then, when the resistances of the magnetoresistive elements ZH1 and ZH2 vary as a result of flux fields $\phi$ to which they are exposed, there will be an output from the bridge 1' having an envelope magnitude which is a function of the flux $\phi$. Peak envelope magnitudes detected by the gated peak detector 12 are used to adjust the constant current I in a compensating direction.

Figure 4:
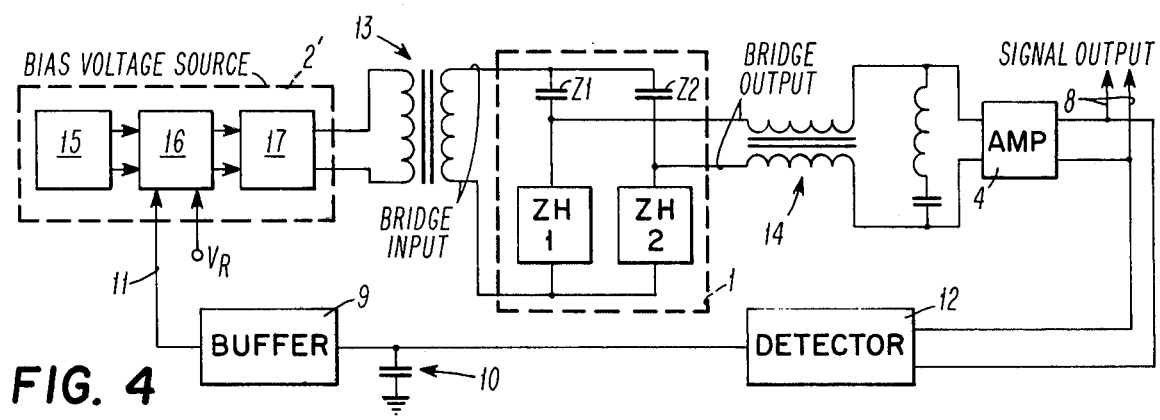

Referring now to FIG. 4, there is shown a block diagram of a circuit for achieving all the advantages of the invention. A bias oscillator 15 supplies the necessary alternating current bias to a voltage-controlled amplifier 16 which varies the output peak voltage over a ratio of as much as 100 to 1 as a function of the relationship between the DC voltage on the line 11 and a fixed reference voltage at input $V_R$. The voltage-controlled amplifier is connected to a bias driver amplifier 17 which isolates the voltage-controlled amplifier 16 from succeeding circuits. An impedance matching transformer 13 connects the bias driver amplifier 17 to the bridge circuit 1 which, for illustration only, shows capacitors as the impedance elements Z1 and Z2. It will be understood that any impedance element may be used; for example, Z1 and Z2 may be resistors, inductors, resonant circuits or the like. The output of the bridge 1 is connected to amplifier 4 by transformer 14 which has an optional filtering series resonant circuit connected across its output. The output of the amplifier 4 is connected to signal output 8 and to gated peak detector 12, an example of which is described in the IBM TECHNICAL DISCLOSURE BULLETIN, Vol. 19, No. 3, August, 1976, pages 810–813. The output of gated peak detector 12 is connected to the averaging capacitor 10 and buffer 9 as previously described.

Figure 5:
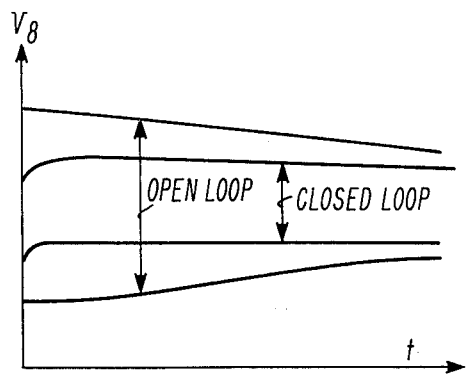
FIGS. 5 and 6 are waveform diagrams illustrating signals present in the embodiments of FIGS. 2 through 4.
Figure 6:
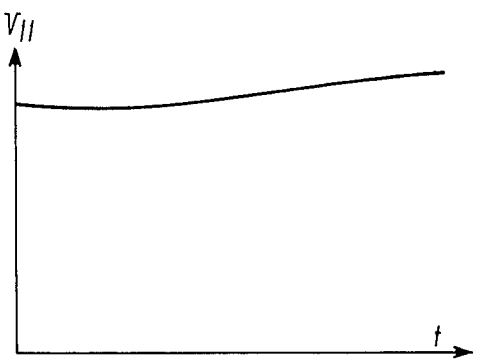

The operation of the circuit of FIG. 4 is explained with reference to FIGS. 5 and 6. FIG. 5 shows the envelope of the signal at output 8 both with the feedback loop provided by the line 11 and without the effect of the feedback loop. For example, the signal at the signal output 8 in FIG. 1, which is the same as if the circuit of FIG. 4 had an open circuit in the line 12, is shown by the open loop curve of FIG. 5. It can be seen that the voltage at the signal output 8 decreases, presumably due to some external cause such as increasing separation between the magnetoresistive elements and the media or perhaps a change in temperature. When the circuit 11 is closed, the closed loop condition of the signal output 8 remains constant. If the signal on line 11 is simultaneously monitored during the closed loop condition, the effect of an external condition becomes visible. The signal voltage on line 11 can be seen to increase and thus compensate for the unidentified external condition which results in the signal output on line 8 being held constant during the closed loop condition.

Figure 7:
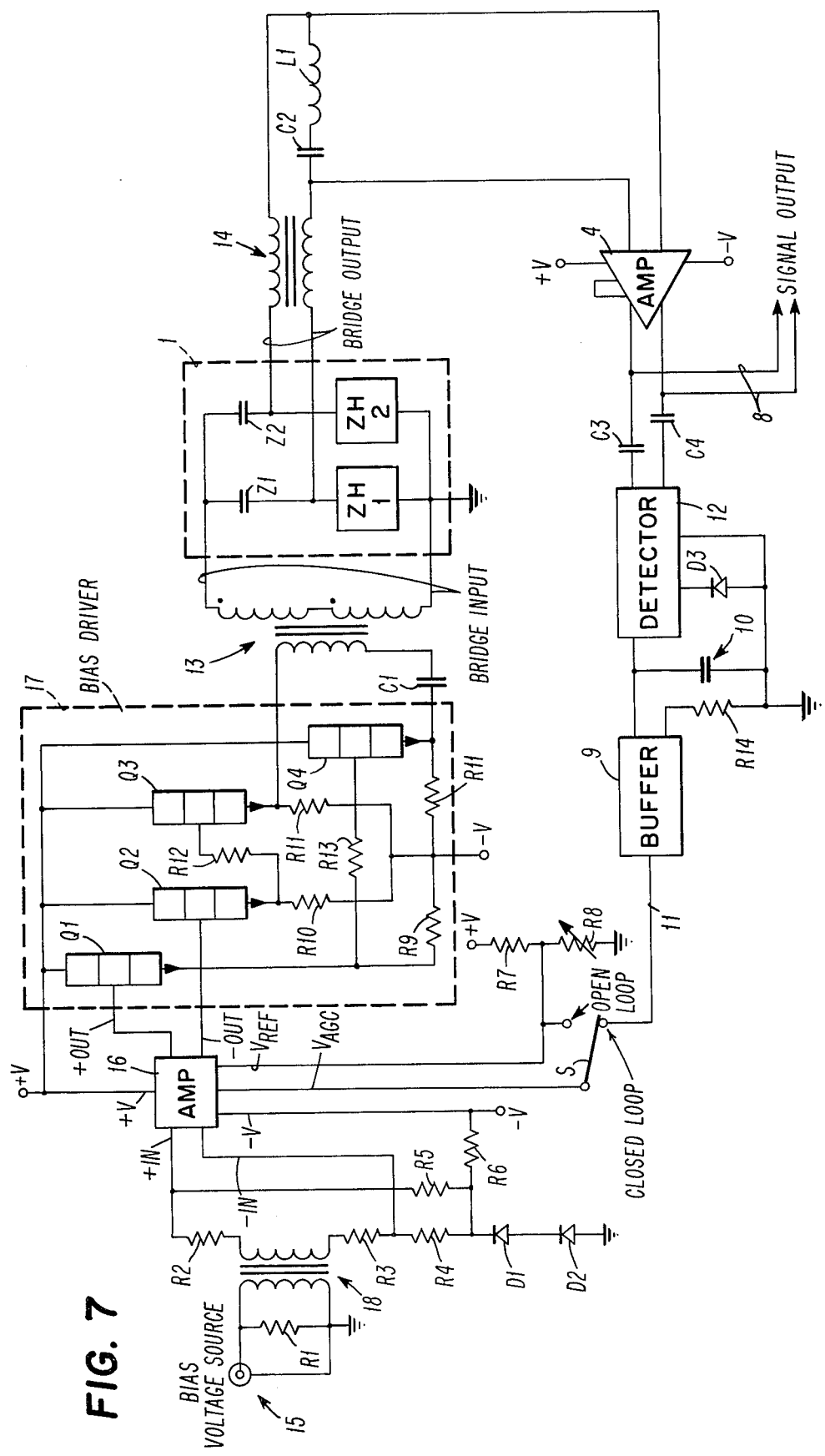
FIG. 7 is a circuit schematic of the embodiment of the invention shown in FIG. 4.

A detailed circuit diagram illustrating one embodiment of the invention is shown in FIG. 7. The bias signal voltages supplied at an input 15 from an oscillator, not shown, are capable of generating the necessary input signal magnitude and frequency. A resistor R1, transformer 18 and resistor network R2-R6 perform the necessary impedance transformation and frequency compensation functions on the bias voltage signal. Diodes D1 and D2 in conjunction with the voltage −V provide an input bias voltage. A voltage-controlled amplifier 16, which may be any conventional operational amplifier, is connected to a bias driver amplifier 17 constructed of transistors Q1-Q4 and resistors R7-R10. The alternating current bias is thus ultimately supplied through capacitor C1 to transformer 13 and bridge 1. The output of the bridge 1 is connected to amplifier 4 via transformer 14 and frequency compensation circuit L1 and C2. The amplifier 4 may be an additional operational amplifier such as the conventional type 733. Signal output is removed from the amplifier 4 via lines 8, and a feedback signal is sensed by the gated peak detector 12 through capacitor C3 and C4. At the output of the gated peak detector 12 a storage capacitor 10 is connected to the buffer amplifier 9 through a resistor R14 which determines the rate of discharge of the capacitor 10. The output of the buffer amplifier 9 is connected via feedback line 11 to the voltage-controlled amplifier 16. A switch S is provided to connect the line 11 to the voltage-controlled amplifier 16 during closed loop operation and to permit open loop operation. In the latter case, the voltage-controlled amplifier is held at a fixed quiescent point by adjusting variable resistor R8.

While the invention has been particularly shown and described with reference to preferred embodiments thereof, it will be understood by those skilled in the art that various changes in form and details may be made therein without departing from the spirit and scope of the invention.

What is claimed is:

1. A magnetic read head circuit comprising:
    a source of magnetic flux manifesting recorded information;
    bias means for supplying an alternating current bias signal having an adjustable amplitude;
    a pair of elements exhibiting a magnetoresistive effect, intercepted by said magnetic flux, connected with a pair of impedance elements in a bridge arrangement having a signal input connected to the bias means, and a signal output which is a function of the bias signal and the intercepted magnetic flux;
    detection means, including storage, connected to the bridge signal output, supplying an output signal representing changes in the average value of the bridge signal output; and
    feedback means interconnecting the detection means output and the bias means for adjusting the bias signal amplitude as a function of the detection means output to maintain the bridge signal output at a predetermined constant average value.

2. The circuit of claim 1 wherein additional pairs of magnetoresistive and impedance elements are connected in bridge arrangements to the bias means.

3. The circuit of claim 2 wherein the detection means includes means for detecting bridge signal output peaks and a capacitor for storing the average DC value of the detected peaks.

4. The circuit of claim 3 wherein the feedback means includes an amplifier having a gain level adjustable by the average DC value stored in the capacitor.

5. A circuit for transducing magnetic flux manifesting recorded information into electrical signals comprising:
    bias means for supplying an adjustable amplitude alternating current bias signal;
    one or more elements exhibiting a resistance variation as a function of intercepted magnetic flux and has an element signal output which is a function of the bias signal and the intercepted magnetic flux;
    detection and averaging means, connected to the element signal output, supplying a detection signal representing changes in the average value of the element signal output; and
    feedback means interconnecting the detection means and the bias means for adjusting the bias signal amplitude as a function of the detection signal to maintain the element signal output at a predetermined constant average value.

6. The circuit of claim 5 wherein the elements are connected in one or more bridge arrangements with other electrical elements.

7. The circuit of claim 6 wherein each bridge has an input connected to the bias means and one bridge has an output connected to the detection means.

8. A method for controlling the reading of magnetic flux manifesting recorded information by elements exhibiting a magnetoresistive effect and intercepted by said magnetic flux including the steps of:
    supplying an adjustable amplitude alternating current bias signal to the elements;
    deriving a signal from the elements which is a function of the bias signal and the intercepted magnetic flux;
    detecting the DC value of the derived signal; and
    adjusting the bias signal amplitude as a function of the detected DC signal to maintain the derived signal substantially at a predetermined constant value.

* * * * *